United States Patent
Noller et al.

(10) Patent No.: US 9,263,296 B2
(45) Date of Patent: Feb. 16, 2016

(54) CHEMICAL MECHANICAL POLISHING (CMP) COMPOSITION COMPRISING TWO TYPES OF CORROSION INHIBITORS

(75) Inventors: Bastian Noller, Lorsch (DE); Michael Lauter, Mannheim (DE); Albert Budiman Sugiharto, Mannheim (DE); Yuzhuo Li, Mannheim (DE); Kenneth Rushing, Paw Paw, MI (US); Diana Franz, Schifferstadt (DE); Roland Böhn, Maxdorf (DE)

(73) Assignee: BASF SE, Ludwigshafen (DE)

( * ) Notice: Subject to any disclaimer, the term of this patent is extended or adjusted under 35 U.S.C. 154(b) by 85 days.

(21) Appl. No.: 14/006,744

(22) PCT Filed: Mar. 19, 2012

(86) PCT No.: PCT/IB2012/051293
§ 371 (c)(1), (2), (4) Date: Mar. 25, 2014

(87) PCT Pub. No.: WO2012/127399
PCT Pub. Date: Sep. 27, 2012

(65) Prior Publication Data
US 2015/0118845 A1    Apr. 30, 2015

Related U.S. Application Data

(60) Provisional application No. 61/446,010, filed on Mar. 22, 2011.

(30) Foreign Application Priority Data

Mar. 22, 2011    (EP) .................................... 11159095

(51) Int. Cl.
H01L 21/321    (2006.01)
C09G 1/04    (2006.01)
(Continued)

(52) U.S. Cl.
CPC .............. *H01L 21/3212* (2013.01); *C09G 1/02* (2013.01); *C09G 1/04* (2013.01); *H01L 21/30625* (2013.01); *C09K 3/1463* (2013.01)

(58) Field of Classification Search
CPC ...... C09G 1/02; C09G 1/04; H01L 21/30625; H01L 21/3212; C09K 3/1463; C09K 13/00
See application file for complete search history.

(56) References Cited

U.S. PATENT DOCUMENTS 6,063,306 A * 5/2000 Kaufman et al. ............ 252/79.4
6,114,249 A    9/2000 Canaperi et al.
(Continued)

FOREIGN PATENT DOCUMENTS

CN    101397480 A    4/2009
EP    1 279 708 A1    1/2003
(Continued)

OTHER PUBLICATIONS

International Search Report issued Jul. 19, 2012, in PCT/162012/051293.

*Primary Examiner* — Duy Deo
(74) *Attorney, Agent, or Firm* — Oblon, McClelland, Maier & Neustadt, L.L.P.

(57) ABSTRACT

A chemical-mechanical polishing ("CMP") composition (P) comprising (A) inorganic particles, organic particles, or a mixture or composite thereof, (B) at least one type of *N*-heterocyclic compound as corrosion inhibitor, (C) at least one type of a further corrosion inhibitor selected from the group consisting of: (C1) an acetylene alcohol, and (C2) a salt or an adduct of (C2a) an amine, and (C2b) a carboxylic acid comprising an amide moiety, (D) at least one type of an oxidizing agent, (E) at least one type of a complexing agent, and (F) an aqueous medium.

25 Claims, 1 Drawing Sheet (51) Int. Cl.
*C09G 1/02* (2006.01)
*H01L 21/306* (2006.01)
*C09K 3/14* (2006.01)

(56) References Cited

U.S. PATENT DOCUMENTS

| | | | |
|---|---|---|---|
| 7,022,608 B2 | 4/2006 | Sun et al. | |
| 7,138,073 B2 | 11/2006 | Minamihaba et al. | |
| 7,311,855 B2 | 12/2007 | Haga et al. | |
| 7,419,910 B2 | 9/2008 | Minamihaba et al. | |
| 7,485,162 B2 | 2/2009 | Matsuda et al. | |
| 2002/0068454 A1 | 6/2002 | Sun et al. | |
| 2003/0216049 A1 | 11/2003 | Sun et al. | |
| 2005/0056810 A1 | 3/2005 | Bian et al. | |
| 2005/0108949 A1 | 5/2005 | Matsuda et al. | |
| 2007/0200089 A1* | 8/2007 | Inaba et al. | 252/79.1 |
| 2007/0232197 A1* | 10/2007 | Amanokura et al. | 451/37 |
| 2007/0293049 A1 | 12/2007 | Minamihaba et al. | |
| 2008/0127573 A1 | 6/2008 | Roh et al. | |
| 2009/0032765 A1 | 2/2009 | Bian et al. | |
| 2009/0087988 A1 | 4/2009 | Saie | |
| 2009/0090888 A1* | 4/2009 | Chang | 252/79.1 |
| 2012/0058641 A1 | 3/2012 | Raman et al. | |
| 2012/0058643 A1 | 3/2012 | Raman et al. | |
| 2012/0231627 A1 | 9/2012 | Raman et al. | |
| 2012/0322264 A1 | 12/2012 | Raman et al. | |
| 2013/0005149 A1 | 1/2013 | Li et al. | |
| 2014/0004703 A1 | 1/2014 | Noller et al. | |

FOREIGN PATENT DOCUMENTS

| | | |
|---|---|---|
| EP | 1 520 892 A2 | 4/2005 |
| JP | 2001-323253 A | 11/2001 |
| JP | 2009-272601 A | 11/2009 |
| KR | 10-2007-0047020 A | 5/2007 |
| WO | WO 2004/063301 A1 | 7/2004 |

* cited by examiner

CHEMICAL MECHANICAL POLISHING (CMP) COMPOSITION COMPRISING TWO TYPES OF CORROSION INHIBITORS

This application is a National Stage of PCT/IB12/051293 filed Mar. 19, 2012 and claims the benefit of U.S. 61/466,010 filed Mar. 22, 2011 and EP 11159095.6 filed Mar. 22, 2011.

This invention essentially relates to a chemical mechanical polishing (CMP) composition and its use in polishing substrates of the semiconductor industry. The CMP composition according to the invention comprises two types of corrosion inhibitors and shows an improved polishing performance.

In the semiconductor industry, chemical mechanical polishing (abbreviated as CMP) is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

In the state of the art, CMP compositions which in general comprise two corrosion inhibitors are known and described, for instance, in the following references:

US 2009/0090888 A1 discloses a CMP composition comprising (a) a polishing abrasive, (b) an oxidizing agent, (c) an accelerating compound, (d) an inhibitor, (e) a co-inhibitor, and (f) a solvent as remaining part. The inhibitor can be an imidazoline-based or a triazole-based compound. The co-inhibitor can be an amine carboxylate or its salt, for example sarcosine.

In the state of the art, CMP compositions comprising acetylene or acetylene-containing compounds are known and described, for instance, in the following references:

U.S. Pat. No. 7,311,855 B2 discloses a CMP slurry comprising cerium oxide particles, an organic compound having an acetylene bond and water. This organic compound can be represented by the formula $R^1$—C≡C—$R^2$, wherein $R^1$ is a hydrogen atom or a substituted or unsubstituted alkyl group of 1 to 5 carbon atoms; and $R^2$ is substituted or unsubstituted alkyl group of 4 to 10 carbon atoms. Furthermore, said organic compound can be represented by the formula wherein $R^3$ to $R^6$ are each independently a hydrogen atom or a substituted or unsubstituted alkyl group of 1 to 5 carbon atoms; $R^7$ and $R^8$ are each independently a substituted or unsubstituted alkylene group of 1 to 5 carbon atoms, and "m" and "n" are each independently 0 or a positive number.

EP 1 279 708 A1 discloses a CMP composition comprising (a) an abrasive, (b) at least one organic compound consisting of polyethylene oxide, polypropylene oxide, polyoxyethylene alkyl ether, polyoxypropylene alkyl ether, polyoxyethylenepolyoxypropylene alkyl ether, or polyoxyalkylene addition polymer having a CC triple bond of the formula wherein each $R^1$ to $R^6$ is H or a C1-10 alkyl group, each X and Y is an ethylene-oxy group or a propylene-oxy group, and each of m and n is a positive number of from 1 to 20, (c) at least one polishing accelerating compound, (d) at least one anticorrosive, (e) hydrogen peroxide, and (f) water.

US 2007/0293049 A1 discloses a slurry for the CMP of Cu film comprising peroxosulfuric acid, a basic amino acid, a complexing agent, a surfactant and colloidal silica. The surfactant can be acetylene glycol, ethylene oxide adducts thereof and acetylene alcohol.

U.S. Pat. No. 7,138,073 B2 discloses a slurry for the CMP of Cu comprising a first complexing agent, a second complexing agent, an oxidizing agent, a polishing rate promoting agent, polishing particles and a surfactant containing potassium dodecylbenzenesulfonate and acetylene diol-based non-ionic surfactant.

U.S. Pat. No. 7,419,910 B2 discloses a CMP slurry comprising a Cu oxidizing agent, a complexing agent forming a Cu organic complex, a non-ionic surfactant, an inorganic particle, and a resin particle. The non-ionic surfactant can be an acetylene diol-based non-ionic surfactant.

JP 2001/323253 A discloses a polishing composition for polishing a magnetic disk substrate comprising water, an abrasive, and a polishing accelerator. The polishing accelerator can be a divalent or higher valent carboxylic acid having an alkyne group. One example for said polishing accelerator is acetylenedicarboxylic acid.

US 2008/0127573 A discloses a polishing composition comprising deionized water, abrasive particles, a pH-adjusting agent, a water-soluble thickener, an acetylene surfactant, and a heterocyclic amine. According to one embodiment, the acetylene surfactant comprises an acetylene alcohol represented by the formula $R_1R_2(OH)CC$=CH, wherein $R_1$ and $R_2$ are each independently $(OCH_2CH_2)_nOCH_2CH_3$ in which n is from 0 to 10. According to another embodiment, the acetylene surfactant comprises an acetylene glycol represented by the formula $R_1R_2(OH)CC$=$CC(OH)R_1R_2$, wherein $R_1$ and $R_2$ are each independently $(OCH_2CH_2)_n$ $OCH_2CH_3$ in which n is from 0 to 10.

In the state of the art, CMP compositions comprising amide-containing carboxylic acids or comprising alkanolamines are known and described, for instance, in the following references:

JP 2009/272601 A discloses a CMP composition comprising water, cerium oxide particles and an additive represented by one of the following formulae:

wherein R1 to R4 are (optionally substituted) monovalent organic groups, amino, H or hydroxy; X1, X2 are optionally substituted divalent organic group; and p, q=0 or 1. The additive can be succinamic acid, maleamic acid, asparagine, glutamine, carboxylic acid, amino acid, and amphoteric surfactant.

KR 2007/047020 A discloses a CMP composition comprising (a) an abrasive, (b) a cyclic compound having an amide bond as a chelating agent, and (c) a compound having an amine group (—NH2), a carboxyl group (—COOH) and an amide bond (—NHCO—), which is preferably selected from glycylglycine, glycylproline, glycylserine, glycylarginine, glycylglutamine and glycylalanine.

U.S. Pat. No. 6,114,249 A discloses a CMP composition comprising colloidal silica and triethanolamine for polishing multiple material substrates, such as silicon wafers containing silicon oxide where a thin underlayer of silicon nitride is used as a stop layer.

U.S. Pat. No. 6,063,306 A discloses a CMP composition comprising (a) an abrasive, (b) an oxidizing agent, and (c) an organic amino compound selected from long chain alkylamines, alcoholamines and mixtures thereof. The alcoholamine is preferably triethanolamine.

One of the objects of the present invention was to provide a CMP composition which shows an improved polishing performance, such as the reduction of erosion and dishing effects, and particularly the combination of high material removal rate (MRR), low hot static etch rates of the to-be-polished metal surfaces (metal-hSER) and low cold static etch rates of the to-be-polished metal surfaces (metal-cSER), low hot metal ion static etch rates with regard to the to-be-polished metal surfaces (metal-hMSER), high ratio of MRR to metal-hSER, high ratio of MRR to metal-cSER, and high ratio of MRR to metal-hMSER. In addition, a further object was to provide a CMP composition which is particularly appropriate and adopted for the CMP of copper-containing layers in a multilevel structure.

Furthermore, a respective CMP process was to be provided.

Accordingly, a CMP composition (P) was found which comprises
(A) inorganic particles, organic particles, or a mixture or composite thereof,
(B) at least one type of N-heterocyclic compound as corrosion inhibitor,
(C) at least one type of a further corrosion inhibitor selected from the group consisting of:
  (C1) an acetylene alcohol, and
  (C2) a salt or an adduct of
    (C2a) an amine, and
    (C2b) a carboxylic acid comprising at least one amide moiety,
(D) at least one type of an oxidizing agent,
(E) at least one type of a complexing agent, and
(F) an aqueous medium.

Moreover, the above-mentioned objects of the invention are achieved by a process for the manufacture of a semiconductor device comprising the polishing of a metal-containing substrate in the presence of said CMP composition.

In addition, the use of CMP composition (P) for polishing substrates which are used in the semiconductor industry has been found, which fulfills the objects of the invention.

Furthermore, the use of a CMP composition (Q) comprising
(A) inorganic particles, organic particles, or a mixture or composite thereof,
(D) at least one type of an oxidizing agent,
(E) at least one type of a complexing agent,
(F) an aqueous medium,
(G) a strong corrosion inhibitor capable of strongly decreasing hot static etch rate of the to-be-polished metal surfaces (metal-hSER) in such a way that the metal-hSER of reference composition (R2) is reduced by at least 75% at a concentration of 0.001 mol/L (G) compared to reference composition (R1),
(H) a weak corrosion inhibitor capable of weakly decreasing the metal-hSER in such a way that the metal-hSER of reference composition (R3) is reduced by not more than 55% at a concentration of 0.001 mol/L (H) compared to reference composition (R1),
for the chemical-mechanical polishing of metal-containing substrates,
wherein
(R1) is identical to CMP composition (Q) but free of (G) and (H),
(R2) is identical to CMP composition (Q) but free of (H), and
(R3) is identical to CMP composition (Q) but free of (G),
the metal-hSER is determined by dipping 1×1 inch [=2.54× 2.54 cm] metal coupon into the corresponding composition for 5 minutes at 60° C. and measuring the loss of mass before and after the dipping,
has been found, which fulfills the objects of the invention.

Preferred embodiments are explained in the claims and the specification. It is understood that combinations of preferred embodiments are within the scope of the present invention.

A semiconductor device can be manufactured by a process which comprises the CMP of a substrate in the presence of the CMP compositions (P) or (Q). Preferably, said process comprises the CMP of a metal-containing substrate, that is a substrate comprising metal in the form of elements, alloys, or compounds such as metal nitrides or oxides. Said process comprises more preferably the CMP of a metal layer of said substrate, most preferably the CMP of a copper layer of said substrate, and for example the CMP of a copper layer of a substrate comprising copper and tantalum.

The CMP composition (P) is used for polishing any substrate used in the semiconductor industry, preferably for polishing a metal-containing substrate, more preferably for polishing a metal layer of a said substrate, most preferably for polishing a copper layer of said substrate, and for example for polishing a copper layer of a substrate comprising copper and tantalum.

With regard to the CMP composition (Q) and its use, said composition is used for polishing a metal-containing substrate, preferably for polishing a metal layer of a said substrate, more preferably for polishing a copper layer of said substrate, and most preferably for polishing a copper layer of a substrate comprising copper and tantalum.

According to the invention, the CMP composition contains inorganic particles, organic particles, or a mixture or composite thereof (A). (A) can be
of one type of inorganic particles,
a mixture or composite of different types of inorganic particles, of one type of organic particles,
a mixture or composite of different types of organic particles, or
a mixture or composite of one or more types of inorganic particles and one or more types of organic particles.

A composite is a composite particle comprising two or more types of particles in such a way that they are mechanically, chemically or in another way bound to each other. An example for a composite is a core-shell particle comprising one type of particle in the outer sphere (shell) and another type of particle in the inner sphere (core).

Generally, the particles (A) can be contained in varying amounts. Preferably, the amount of (A) is not more than 10 wt. %, more preferably not more than 4 wt. %, most preferably not more than 2 wt. %, for example not more than 1 wt. %, based on the total weight of the corresponding composition. Preferably, the amount of (A) is at least 0.005 wt. %, more preferably at least 0.01 wt. %, most preferably at least 0.05 wt. %, for example at least 0.1 wt. %, based on the total weight of the corresponding composition.

Generally, the particles (A) can be contained in varying particle size distributions. The particle size distributions of the particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The mean particle size of the particles (A) can vary within a wide range. The mean particle size is the $d_{50}$ value of the particle size distribution of (A) in the aqueous medium (D) and can be determined using dynamic light scattering techniques. Then, the $d_{50}$ values are calculated under the assumption that particles are essentially spherical. The width of the mean particle size distribution is the distance (given in units of the x-axis) between the two intersection points, where the particle size distribution curve crosses the 50% height of the relative particle counts, wherein the height of the maximal particle counts is standardized as 100% height.

Preferably, the mean particle size of the particles (A) is in the range of from 5 to 500 nm, more preferably in the range of from 5 to 250 nm, most preferably in the range of from 50 to 150 nm, and in particular in the range of from 90 to 130 nm, as measured with dynamic light scattering techniques using instruments such as High Performance Particle Sizer (HPPS) from Malvern Instruments, Ltd. or Horiba LB550.

The particles (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of cubes, cubes with chamfered edges, octahedrons, icosahedrons, nodules or spheres with or without protrusions or indentations. Preferably, they are spherical with no or only very few protrusions or indentations.

The chemical nature of particles (A) is not particularly limited. (A) may be of the same chemical nature or a mixture or composite of particles of different chemical nature. As a rule, particles (A) of the same chemical nature are preferred. Generally, (A) can be
inorganic particles such as a metal, a metal oxide or carbide, including a metalloid, a metalloid oxide or carbide, or
organic particles such as polymer particles,
a mixture or composite of inorganic and organic particles.

Particles (A) are preferably inorganic particles. Among them, oxides and carbides of metals or metalloids are preferred. More preferably, particles (A) are alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures or composites thereof. Most preferably, particles (A) are alumina, ceria, silica, titania, zirconia, or mixtures or composites thereof. In particular, (A) are silica. For example, (A) are colloidal silica. Generally, colloidal silica are fine amorphous, nonporous, and typically spherical silica particles.

In another embodiment in which (A) are organic particles, or a mixture or composite of inorganic and organic particles, polymer particles are preferred. Polymer particles can be homo- or copolymers. The latter may for example be block-copolymers, or statistical copolymers. The homo- or copolymers may have various structures, for instance linear, branched, comb-like, dendrimeric, entangled or cross-linked. The polymer particles may be obtained according to the anionic, cationic, controlled radical, free radical mechanism and by the process of suspension or emulsion polymerisation. Preferably, the polymer particles are at least one of the polystyrenes, polyesters, alkyd resins, polyurethanes, polylactones, polycarbonates, poylacrylates, polymethacrylates, polyethers, poly(N-alkylacrylamide)s, poly(methyl vinyl ether)s, or copolymers comprising at least one of vinylaromatic compounds, acrylates, methacrylates, maleic anhydride acrylamides, methacrylamides, acrylic acid, or methacrylic acid as monomeric units, or mixtures or composites thereof. Among them, polymer particles with a cross-linked structure are preferred.

In another embodiment in which (A) are organic particles, or a mixture or composite of inorganic and organic particles, melamine particles are preferred.

In another embodiment in which (A) are a mixture of inorganic and organic particles, (A) is preferably a mixture of inorganic particles and melamine particles, (A) is more preferably a mixture of inorganic particles selected from the group consisting of alumina, ceria, silica, titania, zirconia, or mixtures or composites thereof, on the one hand and melamine particles on the other hand, and (A) is most preferably a mixture of silica particles and melamine particles.

According to the invention, the CMP composition (P) comprises at least one type of N-heterocyclic compound as corrosion inhibitor (B). Typically, corrosion inhibitors are used in metal CMP compositions, particularly in copper CMP compositions, to reduce the static etch rate while preserving the high material removal rate during the polishing process.

Preferably, (P) comprises one type or a mixture of two types of N-heterocyclic compound (B). More preferably, (P) comprises only one type of N-heterocyclic compound (B).

In general, (B) can be contained in varying amounts. Preferably, the amount of (B) is not more than 4 wt. %, more preferably not more than 1 wt. %, most preferably not more than 0.5 wt. %, for example not more than 0.2 wt. %, based on the total weight of the corresponding composition. Preferably, the amount of (B) is at least 0.0005 wt. %, more preferably at least 0.005 wt. %, most preferably at least 0.01 wt. %, for example at least 0.05 wt. %, based on the total weight of the corresponding composition.

Generally, (B) can be any N-heterocyclic compound. Preferably, (B) is a pyrrole, imidazole, pyrazole, triazole, tetrazole, pyridine, pyridazine, pyrimidine, pyrazine, triazine, thiazole, thiadiazole, thiazine or a derivative thereof. More preferably, (B) is an imidazole, pyrazole, triazole, tetrazole, or a derivative thereof. Most preferably, (B) is a triazole or its derivative. For example, (B) is 1,2,3-triazole, 1,2,4-triazole, benzotriazole, or tolyltriazole.

Generally, (B) can be a substituted or unsubstituted N-heterocyclic compound. In the embodiment in which (B) is a substituted N-heterocyclic compound, the substituents are preferably halogen atoms, hydroxyl, alkoxy, thiol, amino, imino, nitro, carboxy, alkylcarboxy, sulfonyl, alkyl, aryl, alkylaryl, or arylalkyl groups, more preferably halogen atoms, hydroxyl, alkyl, aryl, alkylaryl, or arylalkyl groups, most preferably alkyl, aryl or alkylaryl groups.

In general, the solubility of (B) in an aqueous medium can vary within a wide range. The solubility of (B) in water at pH 7 at 25° C. under atmospheric pressure is preferably at least 0.2 g/L, more preferably at least 1 g/L, most preferably at least 3 g/L, for example at least 6 g/L. Said solubility can be determined by evaporating the solvent and measuring the remaining mass in the saturated solution.

According to the invention, the CMP composition (P) comprises at least one type of a further corrosion inhibitor (C) selected from the group consisting of:
(C1) an acetylene alcohol, and
(C2) a salt or an adduct of
  (C2a) an amine, and
  (C2b) a carboxylic acid comprising at least one amide moiety.

Preferably, (P) comprises one type or a mixture of two types of a further corrosion inhibitor (C). More preferably, (P) comprises only one type of a further corrosion inhibitor (C).

In general, (C) can be contained in varying amounts. Preferably, the amount of (C) is not more than 10 wt. %, more preferably not more than 5 wt. %, most preferably not more than 2 wt. %, for example not more than 0.8 wt. %, based on the total weight of the corresponding composition. Preferably, the amount of (C) is at least 0.001 wt. %, more preferably at least 0.01 wt. %, most preferably at least 0.05 wt. %, for example at least 0.1 wt. %, based on the total weight of the corresponding composition.

Generally, (C1), (C2a), or (C2b) can be a substituted or unsubstituted compound. In the embodiment in which (C1), (C2a), or (C2b) is a substituted compound, the substituents are preferably halogen atoms, hydroxyl, alkoxy, thiol, amino, imino, nitro, carboxy, alkylcarboxy, sulfonyl, alkyl, aryl, alkylaryl, or arylalkyl groups, more preferably halogen atoms, hydroxyl, alkyl, aryl, alkylaryl, or arylalkyl groups, most preferably alkyl, aryl or alkylaryl groups.

In general, the solubility of (B) in an aqueous medium can vary within a wide range. The solubility of (B) in water at pH 7 at 25° C. under atmospheric pressure is preferably at least 0.2 g/L, more preferably at least 1 g/L, most preferably at least 3 g/L, for example at least 6 g/L. Said solubility can be determined by evaporating the solvent and measuring the remaining mass in the saturated solution.

In one embodiment, (C) is an acetylene alcohol (C1). Generally, (C1) can be any acetylene alcohol. Preferably, (C1) is an acetylene alcohol comprising an ether moiety, an acetylene diol, or a substituted or unsubstituted 2-propyn-1-ol. More preferably, (C1) is an acetylene alcohol comprising an ether moiety, or an acetylene diol.

In the embodiment in which (C1) is an acetylene alcohol comprising an ether moiety, (C1) is more preferably a (prop-2-ynyloxy)-substituted alcohol, most preferably a (prop-2-ynyloxy)-substituted $C_1$-$C_{15}$ alcohol, particularly a (prop-2-ynyloxy)-substituted $C_2$-$C_8$ alcohol, and for example 2-(prop-2-ynyloxy)ethanol, 2-(prop-2-ynyloxy)propanol, 2-(prop-2-ynyloxy)butanol, or 2-(prop-2-ynyloxy)pentanol.

In the embodiment in which (C1) is an acetylene diol, (C1) is more preferably a dihydroxy-substituted $C_4$-$C_{15}$ alkyne, most preferably a dihydroxy-substituted $C_4$-$C_8$ alkyne, particularly an internal $C_4$-$C_8$ alkyne bearing one hydroxyl group on each end of the alkyne chain, and for example 2-butyne-1,4-diol.

In the embodiment in which (C1) is a substituted or unsubstituted 2-propyn-1-ol, (C1) is preferably 1-alkyl-2-propyn-1-ol, 1,1-dialkyl-2-propyn-1-ol, or unsubstituted 2-propyn-1-ol. Examples of 1-alkyl-2-propyn-1-ols are 3-butyn-2-ol, or 4-ethyl-1-octyn-3-ol. Examples of 1,1-dialkyl-2-propyn-1-ols are 2-methyl-3-butyn-2-ol, 1-ethynyl-1-cyclohexanol.

In a further embodiment, (C) is
(C2) a salt or an adduct of
  (C2a) an amine, and
  (C2b) a carboxylic acid comprising at least one amide moiety.

In general, (C2) can be any salt or adduct of (C2a) and (C2b). (C2) is preferably a salt of (C2a) and (C2b), more preferably a 1:1-salt of (C2a) and (C2b).

Generally, (C2a) can be any amine. (C2a) is preferably a trialkanolamine, more preferably a trialkanolamine in which the alkanol part is a $C_1$-$C_{15}$ alkanol, most preferably a trialkanolamine in which the alkanol part is a $C_1$-$C_8$ alkanol, particularly a trialkanolamine in which the alkanol part is a $C_2$-$C_5$ alkanol, for example triethanolamine (2,2',2"-nitrilotris(ethanol)).

In general, (C2b) can be any carboxylic acid comprising at least one amide moiety. The amide moiety is separate from the COOH group of the carboxylic acid, i.e. the amide moiety does not share any atoms with the COOH group of the carboxylic acid.

The number of COOH groups comprised in (C2b) is preferably 1 to 8, more preferably 1 to 4, most preferably 1 to 2, for example 1. The number of amide moieties comprised in (C2b) is preferably 1 to 8, more preferably 1 to 4, most preferably 1 to 2, for example 1.

The amide moieties comprised in (C2b) can be primary amide (i.e. nitrogen atom of the amide is bound to 1 carbon atom only), secondary amide (i.e. nitrogen atom of the amide is bound to 2 carbon atoms) or tertiary amide (i.e. nitrogen atom of the amide is bound to 3 carbon atoms) moieties. The amide moieties comprised in (C2b) are preferably secondary or tertiary amide moieties, more preferably secondary amide moieties.

(C2b) is preferably a $C_2$ to $C_{40}$ carboxylic acid, more preferably a $C_2$ to $C_{25}$ carboxylic acid, most preferably a $C_3$ to $C_{15}$ carboxylic acid, particularly a $C_3$ to $C_8$ carboxylic acid, for example a $C_4$ to $C_6$ carboxylic acid comprising at least one amide moiety. In this regard, the longest main alkyl chain from the carbon atom of the COOH group to the carbon atom of the amide moiety is relevant for determining the number of carbon atoms ($C_n$), wherein both of the said carbon atoms are included in the number $C_n$.

(C2b) is preferably an unsaturated carboxylic acid, more preferably an aryl or an α,β-unsaturated carboxylic acid, most preferably a benzoic acid, 2-butenoic acid or 2-pentenoic acid comprising at least one amide moiety.

In a further embodiment, (C2b) is preferably an unsaturated carboxylic acid comprising one amide moiety or an unsaturated monocarboxylic acid comprising at least one amide moiety, more preferably an unsaturated monocarboxylic acid comprising one amide moiety, most preferably an unsaturated $C_3$ to $C_{15}$ monocarboxylic acid comprising one amide moiety, particularly an (alkylamino)carbonyl-substituted α,β-unsaturated $C_3$ to $C_8$ carboxylic acid, or an (alkylamino)carbonyl-substituted benzoic acid, for example 4-[(2-ethylhexyl)amino]-4-oxoisocrotonic acid, or 2-[[(2-ethylhexyl)methylamino]carbonyl]-benzoic acid.

According to the invention, the CMP compositions (P) and (Q) comprise at least one oxidizing agent (D), preferably one oxidizing agent. In general, the oxidizing agent is a compound which is capable of oxidizing the to-be-polished substrate or one of its layers. Preferably, (D) is a per-type oxidizer. More preferably, (D) is a peroxide, persulfate, perchlorate, perbromate, periodate, permanganate, or a derivative thereof. Most preferably, (D) is a peroxide or persulfate. Particularly, (D) is a peroxide. For example, (D) is hydrogen peroxide.

In general, (D) can be contained in varying amounts. Preferably, the amount of (D) is not more than 20 wt. %, more preferably not more than 10 wt. %, most preferably not more than 5 wt. %, for example not more than 2 wt. %, based on the total weight of the corresponding composition. Preferably, the amount of (D) is at least 0.05 wt. %, more preferably at least 0.1 wt. %, most preferably at least 0.5 wt. %, for example at least 1 wt. %, based on the total weight of the corresponding composition.

According to the invention, the CMP compositions (P) and (Q) comprise at least one complexing agent (E), for example one complexing agent. In general, the complexing agent is a compound which is capable of complexing the ions of the to-be-polished substrate or of one of its layers. Preferably, (E) is a carboxylic acid having at least two COOH groups, an N-containing carboxylic acid, N-containing sulfonic acid, N-containing sulfuric acid, N-containing phosphonic acid, N-containing phosphoric acid, or a salt thereof. More preferably, (E) is a carboxylic acid having at least two COOH groups, an N-containing carboxylic acid, or a salt thereof. Most preferably, (E) is an amino acid, or a salt thereof. For example, (E) is glycine, serine, alanine, hystidine, or a salt thereof.

In general, (E) can be contained in varying amounts. Preferably, the amount of (E) is not more than 20 wt. %, more preferably not more than 10 wt. %, most preferably not more than 5 wt. %, for example not more than 2 wt. %, based on the total weight of the corresponding composition. Preferably, the amount of (E) is at least 0.001 wt. %, more preferably at least 0.01 wt. %, most preferably at least 0.08 wt. %, for example at least 0.5 wt. %, based on the total weight of the corresponding composition.

According to the invention, the CMP compositions (P) and (Q) contain an aqueous medium (F). (F) can be of one type or a mixture of different types of aqueous media.

In general, the aqueous medium (F) can be any medium which contains water. Preferably, the aqueous medium (F) is a mixture of water and an organic solvent miscible with water (e.g. an alcohol, preferably a $C_1$ to $C_3$ alcohol, or an alkylene glycol derivative). More preferably, the aqueous medium (F) is water. Most preferably, aqueous medium (F) is de-ionized water.

If the amounts of the components other than (F) are in total x % by weight of the CMP composition, then the amount of (F) is (100−x) % by weight of the CMP composition.

According to the invention, the CMP composition (Q) contains a strong corrosion inhibitor (G) which is capable of strongly decreasing the hot static etch rate of the to-be-polished metal surfaces (metal-hSER) in such a way that the metal-hSER of reference composition (R2) is reduced by at least 75% at a concentration of 0.001 mol/L (G) compared to reference composition (R1), wherein (R1) is identical to CMP composition (Q) but free of (G) and (H), and (R2) is identical to CMP composition (Q) but free of (H).

(G) is capable of strongly decreasing the metal-hSER in such a way that the metal-hSER of (R2) is reduced by preferably at least 78%, more preferably at least 81%, most preferably at least 84%, for example at least 87%, at a concentration of 0.001 mol/L (G) compared to (R1).

In the embodiment in which the to-be-polished metal surface is a copper surface, (G) is capable of strongly decreasing the hot static etch rate of the copper surface (copper-hSER) in such a way that the copper-hSER of (R2) is reduced by at least 75%, preferably at least 78%, more preferably at least 81%, most preferably at least 85%, for example at least 90%, at a concentration of 0.001 mol/L (G) compared to (R1).

In general, (G) can be contained in varying amounts. Preferably, the amount of (G) is not more than 4 wt. %, more preferably not more than 1 wt. %, most preferably not more than 0.5 wt. %, for example not more than 0.2 wt. %, based on the total weight of the corresponding composition. Preferably, the amount of (G) is at least 0.0005 wt. %, more preferably at least 0.005 wt. %, most preferably at least 0.01 wt. %, for example at least 0.05 wt. %, based on the total weight of the corresponding composition.

Generally, (G) can be of any chemical nature. Preferably, (G) is a heterocyclic compound. More preferably, (G) is a pyrrole, imidazole, pyrazole, triazole, tetrazole, pyridine, pyridazine, pyrimidine, pyrazine, triazine, thiazole, thiadiazole, thiazine or a derivative thereof. Most preferably, (G) is an imidazole, pyrazole, triazole, tetrazole, or a derivative thereof. Particularly, (G) is a triazole or its derivative. For example, (G) is 1,2,3-triazole, 1,2,4-triazole, benzotriazole, or tolyltriazole.

According to the invention, the CMP composition (Q) contains a weak corrosion inhibitor (H) which is capable of weakly decreasing the metal-hSER in such a way that the metal-hSER of reference composition (R3) is reduced by not more than 55% at a concentration of 0.001 mol/L (H) compared to reference composition (R1), wherein (R1) is identical to CMP composition (Q) but free of (G) and (H), and (R3) is identical to CMP composition (Q) but free of (G).

(H) is capable of weakly decreasing the metal-hSER in such a way that the metal-hSER of (R3) is reduced by preferably not more than 50%, more preferably not more than 45%, most preferably not more than 35%, for example not more than 25%, at a concentration of 0.001 mol/L (H) compared to reference composition (R1).

In the embodiment in which the to-be-polished metal surface is a copper surface, (H) is capable of weakly decreasing the copper-hSER in such a way that the copper-hSER of (R3) is reduced by not more than 55%, preferably not more than 50%, more preferably not more than 45%, most preferably not more than 35%, for example not more than 25%, at a concentration of 0.001 mol/L (H) compared to reference composition (R1).

In general, (H) can be contained in varying amounts. Preferably, the amount of (H) is not more than 10 wt. %, more preferably not more than 5 wt. %, most preferably not more than 2 wt. %, for example not more than 0.8 wt. %, based on the total weight of the corresponding composition. Preferably, the amount of (H) is at least 0.001 wt. %, more preferably at least 0.01 wt. %, most preferably at least 0.05 wt. %, for example at least 0.1 wt. %, based on the total weight of the corresponding composition.

Generally, (H) can be of any chemical nature. In one embodiment, (H) is preferably an acetylene alcohol, more preferably an acetylene alcohol comprising an ether moiety or an acetylene diol, most preferably a (prop-2-ynyloxy)-substituted $C_1$-$C_{15}$ alcohol or a dihydroxy-substituted $C_4$-$C_8$ alkyne, for example 2-(prop-2-ynyloxy)ethanol, 2-(prop-2-ynyloxy)propanol, 2-(prop-2-ynyloxy)butanol, 2-(prop-2-ynyloxy)pentanol, or 2-butyne-1,4-diol. In another embodiment, (H) is preferably a salt or adduct of an amine and a carboxylic acid comprising at least one amide moiety, more preferably a salt or adduct of trialkanolamine and a carboxylic acid comprising one amide moiety, most preferably preferably a salt or adduct of trialkanolamine and an unsaturated monocarboxylic acid comprising one amide moiety, for example a salt or adduct of triethanolamine (2,2',2"-nitrilotris (ethanol)) and 4-[(2-ethylhexyl)amino]-4-oxoisocrotonic acid, or a salt or adduct of triethanolamine and 2-[[(2-ethylhexyl)methylamino]carbonyl]-benzoic acid.

The properties of the CMP compositions (P) and (Q), such as stability and polishing performance, may depend on the pH of the corresponding composition. Preferably, the pH value of the compositions used or according to the invention respectively is in the range of from 3 to 10, more preferably from 4.5 to 8, and most preferably from 5.5 to 7.

The CMP compositions used or according to the invention respectively may also contain, if necessary, various other additives, including but not limited to pH adjusting agents, stabilizers, surfactants etc. Said other additives are for instance those commonly employed in CMP compositions and thus known to the person skilled in the art. Such addition can for example stabilize the dispersion, or improve the polishing performance, or the selectivity between different layers.

If present, said additive can be contained in varying amounts. Preferably, the amount of said additive is not more than 10 wt. %, more preferably not more than 1 wt. %, most preferably not more than 0.1 wt. %, for example not more than 0.01 wt. %, based on the total weight of the corresponding composition. Preferably, the amount of said additive is at least 0.0001 wt. %, more preferably at least 0.001 wt. %, most preferably at least 0.01 wt. %, for example at least 0.1 wt. %, based on the total weight of the corresponding composition.

For the embodiments below, all concentration ranges or concentration specifications in wt. % (percent by weight) are based on the total weight of the corresponding composition, unless stated otherwise.

According to one embodiment, the CMP composition (P) comprises:
(A) silica particles, in a concentration of from 0.01 to 2 wt. %,
(B) a triazole, or its derivative as corrosion inhibitor, in a concentration of from 0.005 to 1 wt. %,
(C) a further corrosion inhibitor selected from the group consisting of
  (C1) an acetylene alcohol, and
  (C2) a salt or adduct of (C2a) an amine and (C2b) a carboxylic acid comprising an amide moiety,
  in a total concentration of from 0.01 to 5 wt. %,
(D) a per-type oxidizer, in a concentration of from 0.05 to 10 wt. %,
(E) a complexing agent selected from the group consisting of a carboxylic acid having at least two COOH groups, an N-containing carboxylic acid, N-containing sulfonic acid, N-containing sulfuric acid, N-containing phosphonic acid, N-containing phosphoric acid, or a salt thereof, in a concentration of 0.01 to 5 wt. %, and
(F) an aqueous medium.

According to a further embodiment, the CMP composition (P) comprises:
(A) silica particles, in a concentration of from 0.01 to 2 wt. %,
(B) a triazole, or its derivative as corrosion inhibitor, in a concentration of from 0.005 to 1 wt. %,
(C) a further corrosion inhibitor which is
  (C1) an acetylene alcohol comprising a ether moiety
  in a concentration of from 0.01 to 5 wt. %,
(D) a peroxide or persulfate as oxidizing agent, in a concentration of from 0.05 to 10 wt. %,
(E) a complexing agent selected from the group consisting of a carboxylic acid having at least two COOH groups, an N-containing carboxylic acid, N-containing sulfonic acid, N-containing sulfuric acid, N-containing phosphonic acid, N-containing phosphoric acid, or a salt thereof, in a concentration of 0.01 to 5 wt. %, and
(F) an aqueous medium.

According to a further embodiment, the CMP composition (P) comprises:
(A) silica particles, in a concentration of from 0.01 to 2 wt. %,
(B) a triazole, or its derivative as corrosion inhibitor, in a concentration of from 0.005 to 1 wt. %,
(C) a further corrosion inhibitor which is
  (C1) an acetylene diol
  in a concentration of from 0.01 to 5 wt. %,
(D) a peroxide or persulfate as oxidizing agent, in a concentration of from 0.05 to 10 wt. %,
(E) a complexing agent selected from the group consisting of a carboxylic acid having at least two COOH groups, an N-containing carboxylic acid, N-containing sulfonic acid, N-containing sulfuric acid, N-containing phosphonic acid, N-containing phosphoric acid, or a salt thereof, in a concentration of 0.01 to 5 wt. %, and
(F) an aqueous medium.

According to a further embodiment, the CMP composition (P) comprises:
(A) silica particles, in a concentration of from 0.01 to 2 wt. %,
(B) a triazole, or its derivative as corrosion inhibitor, in a concentration of from 0.005 to 1 wt. %,
(C) a further corrosion inhibitor which is
  (C2) a salt or adduct of
    (C2a) a trialkanolamine and
    (C2b) an unsaturated carboxylic acid comprising at least one amide moiety
  in a concentration of from 0.01 to 5 wt. %,
(D) a peroxide or persulfate as oxidizing agent, in a concentration of from 0.05 to 10 wt. %,
(E) a complexing agent selected from the group consisting of a carboxylic acid having at least two COOH groups, an N-containing carboxylic acid, N-containing sulfonic acid, N-containing sulfuric acid, N-containing phosphonic acid, N-containing phosphoric acid, or a salt thereof, in a concentration of 0.01 to 5 wt. %, and
(F) an aqueous medium.

According to a further embodiment, the CMP composition (P) comprises:
(A) silica particles, in a concentration of from 0.01 to 2 wt. %,
(B) 1,2,3-triazole, 1,2,4-triazole, benzotriazole, or tolyltriazole as corrosion inhibitor, in a concentration of from 0.005 to 1 wt. %,
(C) a further corrosion inhibitor which is
  (C1) a (prop-2-ynyloxy)-substituted alcohol
  in a concentration of from 0.01 to 5 wt. %,
(D) a peroxide as oxidizing agent, in a concentration of from 0.05 to 10 wt. %,
(E) a carboxylic acid having at least two COOH groups, an N-containing carboxylic acid, or a salt thereof as complexing agent in a concentration of 0.01 to 5 wt. %, and
(F) an aqueous medium.

According to a further embodiment, the CMP composition (P) comprises:
(A) silica particles, in a concentration of from 0.01 to 2 wt. %,
(B) 1,2,3-triazole, 1,2,4-triazole, benzotriazole, or tolyltriazole as corrosion inhibitor, in a concentration of from 0.005 to 1 wt. %, (C) a further corrosion inhibitor which is
(C2) a salt or adduct of
(C2a) a trialkanolamine and
(C2b) an (alkylamino)carbonyl-substituted α,β-unsaturated $C_3$ to $C_8$ carboxylic acid, or an (alkylamino)carbonyl-substituted benzoic acid
in a concentration of from 0.01 to 5 wt. %,
(D) a peroxide as oxidizing agent, in a concentration of from 0.05 to 10 wt. %,
(E) a carboxylic acid having at least two COOH groups, an N-containing carboxylic acid, or a salt thereof as complexing agent in a concentration of 0.01 to 5 wt. %, and
(F) an aqueous medium.

Processes for preparing CMP compositions are generally known. These processes may be applied to the preparation of the CMP composition of the invention. This can be carried out by dispersing or dissolving the above-described components (A) and (B) in the aqueous medium (C), preferably water, and optionally by adjusting the pH value through adding an acid, a base, a buffer or an pH adjusting agent. For this purpose the customary and standard mixing processes and mixing apparatuses such as agitated vessels, high shear impellers, ultrasonic mixers, homogenizer nozzles or counterflow mixers, can be used.

The CMP compositions (P) are preferably prepared by dispersing the particles (A), dispersing and/or dissolving the components (B), (C), (D) and (E) in the aqueous medium (F). The CMP compositions (Q) are preferably prepared by dispersing the particles (A), dispersing and/or dissolving the components (G), (H), (D) and (E) in the aqueous medium (F).

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention the CMP composition of the invention is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded independently from each other.

For further details reference is made to WO 2004/063301 A1, in particular page 16, paragraph [0036] to page 18, paragraph [0040] in conjunction with the FIG. 2.

By way of the CMP process of the invention and/or using the CMP compositions (P) and (Q) of the invention, wafers with integrated circuits comprising a metal layer can be obtained which have an excellent functionality.

The CMP compositions (P) and (Q) of the invention can be used in the CMP process as ready-to-use slurry, they have a long shelf-life and show a stable particle size distribution over long time. Thus, they are easy to handle and to store. They show an excellent polishing performance, particularly with regard to material removal rate (MRR), static etch rates (SER), and selectivity. For example the combination of a high MRR, low metal-hSER, low metal-cSER, low metal-hMSER, high ratio of MRR to metal-hSER, high ratio of MRR to metal-cSER, high ratio of MRR to metal-hMSER can be obtained when a substrate comprising a copper layer is polished. Since the amounts of its components are held down to a minimum, the CMP compositions (P) and (Q) can be used in a cost-effective way.

EXAMPLES AND COMPARATIVE EXAMPLES

Analytical Methods

The pH value is measured with a pH electrode (Schott, blue line, pH 0-14/−5 . . . 100° C./3 mol/L sodium chloride).

The metal-hSER is determined by dipping 1×1 inch [=2.54×2.54 cm] metal coupon into the corresponding composition for 5 minutes at 60° C. and measuring the loss of mass before and after the dipping.

The metal-cSER is determined by dipping 1×1 inch [=2.54×2.54 cm] metal coupon into the corresponding composition for 5 minutes at 25° C. and measuring the loss of mass before and after the dipping.

The metal-hMSER is determined by dipping 1×1 inch [=2.54×2.54 cm] metal coupon into the corresponding composition for 5 minutes at 60° C. and measuring the loss of mass before and after the dipping, after adding 500 ppm of metal salt, for example metal nitrate, to imitate the metal ions released in the polishing process.

Cu-cSER (cold static etch rate of a copper layer) is determined by dipping 1×1 inch [=2.54×2.54 cm] copper coupon into the corresponding composition for 5 minutes at 25° C. and measuring the loss of mass before and after the dipping.

Cu-hSER (hot static etch rate of a copper layer) is determined by dipping 1×1 inch [=2.54×2.54 cm] copper coupon into the corresponding composition for 5 minutes at 60° C. and measuring the loss of mass before and after the dipping.

Cu-hCSER (hot copper ion static etch rate with regard to a copper layer) is determined by dipping 1×1 inch [=2.54×2.54 cm] copper coupon into the corresponding composition for 5 minutes at 60° C. and measuring the loss of mass before and after the dipping, after adding 500 ppm of $Cu(NO_3)_2$ to imitate the copper ions released in the polishing process.

General Procedure for the CMP Experiments

First Trends of formulations were evaluated on 2 inch [=5.08 cm] copper level using Bühler table polishers. For further evaluation and confirmation a 200 mm Strasbaugh 6EC polisher was used (polishing time was 60 s).

For the evaluation on benchtop following parameters were chosen:

Powerpro 5000 Bühler. DF=40 N, Table speed 150 rpm, Platen speed 150 rpm, slurry flow 200 ml/min, 20 s conditioning, 1 min polishing time, IC1000 pad, diamond conditioner (3M).

The pad is conditioned by several sweeps, before a new type of CMP composition is used for CMP. For the determination of removal rates at least 3 wafers are polished and the data obtained from these experiments are averaged.

The CMP composition is stirred in the local supply station.

The material removal rates (MRR) for 2 inch [=5.08 cm] discs polished by the CMP composition are determined by difference of weight of the coated wafers before and after CMP, using a Sartorius LA310 S scale. The difference of weight can be converted into the difference of film thickness since the density (8.94 g/cm3 for copper) and the surface area of the polished material are known. Dividing the difference of film thickness by the polishing time provides the values of the material removal rate.

Inorganic Particles, Organic Particles, Mixture or Composite Thereof (A)

Silica particles used as particles (A) are of NexSil™ (Nyacol) type. NexSil™ 85K are potassium-stabilized colloidal silica having a typical particle size of 50 nm and a typical surface area of 55 m²/g. NexSil™ 5 are sodium-stabilized colloidal silica having a typical particle size of 6 nm and a typical surface area of 450 m²/g.

Melamine particles used as particles (A) are formed in the solution by adding melamine into the slurry. The particles usually have a broad size distribution but are not limited to a large size distribution. The melamine can either be milled or mixed into the aqueous medium by dissolution methods known to a person skilled in the art.

Further corrosion inhibitors (C):
2-(prop-2-ynyloxy)propanol
2-(prop-2-ynyloxy)pentanol
2-butyne-1,4-diol
FC1=salt or adduct of triethanolamine (2,2',2"-nitrilotris (ethanol)) and 4-[(2-ethylhexyl)amino]-4-oxoisocrotonic acid
FC2=salt or adduct of triethanolamine (2,2',2"-nitrilotris (ethanol)) and 2-[[(2-ethylhexyl)methylamino]carbonyl]-benzoic acid Examples 1 to 8 (Compositions of the Invention) and Comparative Examples V1 to V4 (Comparative Compositions)

An aqueous dispersion containing the components as listed in Table 1 and 2 was prepared, furnishing the CMP compositions (P) of the examples 1 to 6 and the comparative examples V1 to V2. For all these examples, the pH was adjusted to 6 with KOH or HNO₃.

An aqueous dispersion containing the components as listed in Table 2 was prepared, furnishing the CMP compositions (Q) of the examples 7 to 8 and the comparative examples V3 to V4. For all these examples, the pH was adjusted to 6 with KOH or HNO₃.

Data for the polishing performance of the CMP compositions (P) of the examples 1 to 6 and of the comparative examples V1 to V2 are given in the Table 1.

Data for the polishing performance of the CMP compositions (Q) of the examples 7 to 8 and of the comparative examples V3 to V4 are given in the Table 2.

TABLE 1

Compositions of the examples 1 to 6 and of the comparative examples V1 to V2, and Cu-cSER, Cu-hSER, Cu-hCSER data as well as their material removal rates (MRR) and dishing data in the copper CMP process using these compositions, wherein the aqueous medium (F) is de-ionized water (MRR measured on 2 inch [=5.08 cm] copper discs with Powerpro 5000 Bühler polisher, dishing measured on 8 inch [=20.32 cm] copper discs with Strasbaugh 6EC polisher)

|  | Example 1 | Example 2 | Example 3 | Comparative Example V1 |
|---|---|---|---|---|
| Particles (A) | Melamine 0.3 wt. %, and NexSil ™ 5 0.08 wt. % | Melamine 0.3 wt. %, and NexSil ™ 5 0.08 wt. % | Melamine 0.3 wt. %, and NexSil ™ 5 0.08 wt. % | Melamine 0.3 wt. %, and NexSil ™ 5 0.08 wt. % |
| Corrosion inhibitor (B) | Benzotriazole 0.07 wt. % | Benzotriazole 0.07 wt. % | Benzotriazole 0.07 wt. % | Benzotriazole 0.07 wt. % |
| Further corrosion inhibitor (C) | FC2 0.005 wt. % | 2-Butyne-1,4-diol 0.1 wt. % | FC2 0.01 wt. % | — |
| Complexing agent (D) | Glycine 0.6 wt. %, and chloride 0.02 wt. % (added as potassium chloride) | Glycine 0.6 wt. %, and chloride 0.02 wt. % (added as potassium chloride) | Glycine 0.6 wt. %, and Chloride 0.02 wt. % (added as potassium chloride) | Glycine 0.6 wt. %, and chloride 0.02 wt. % (added as potassium chloride) |
| Oxidizing agent (E) | H₂O₂ 3 wt. % | H₂O₂ 3 wt. % | H₂O₂ 3 wt. % | H₂O₂ 3 wt. % |
| pH | 5 | 5 | 5 | 5 |
| MRR in Å/min | 9392 | 11140 | 8799 | 10897 |
| cSER in Å/min | 21 | 36 | 26 | 47 |
| hSER in Å/min | 107 | 126 | 79 | 206 |
| Cu-hCSER in Å/min | — | — | — | — |

TABLE 1-continued

Compositions of the examples 1 to 6 and of the comparative examples V1 to V2, and Cu-cSER, Cu-hSER, Cu-hCSER data as well as their material removal rates (MRR) and dishing data in the copper CMP process using these compositions, wherein the aqueous medium (F) is de-ionized water (MRR measured on 2 inch [=5.08 cm] copper discs with Powerpro 5000 Bühler polisher, dishing measured on 8 inch [=20.32 cm] copper discs with Strasbaugh 6EC polisher)

| | Example 4 | Example 5 | Example 6 | Comparative Example V2 |
|---|---|---|---|---|
| Particles (A) | Melamine 0.3 wt. %, and NexSil ™ 5 0.05 wt. % | Melamine 0.3 wt. %, and NexSil ™ 5 0.05 wt. % | Melamine 0.3 wt. %, and NexSil ™ 5 0.05 wt. % | Melamine 0.3 wt. %, and NexSil ™ 5 0.05 wt. % |
| Corrosion inhibitor (B) | tolyltriazole 0.04 wt. % | tolyltriazole 0.04 wt. % | tolyltriazole 0.04 wt. % | tolyltriazole 0.04 wt. % |
| Further corrosion inhibitor (C) | 2-Butyne-1,4-diol 0.005 wt. % | 2-(prop-2-ynyloxy)propanol 0.01 wt. % | FC2 0.005 wt. % | — |
| Complexing agent (D) | Glutamic acid 0.6 wt. %, and chloride 0.02 wt. % (added as potassium chloride) | Glutamic acid 0.6 wt. %, and chloride 0.02 wt. % (added as potassium chloride) | Glutamic acid 0.6 wt. %, and chloride 0.02 wt. % (added as potassium chloride) | Glutamic acid 0.6 wt. %, and chloride 0.02 wt. % (added as potassium chloride) |
| Oxidizing agent (E) | $H_2O_2$ 3 wt. % | $H_2O_2$ 3 wt. % | $H_2O_2$ 3 wt. % | $H_2O_2$ 3 wt. % |
| pH | 5.6 | 5.6 | 5.6 | 5.6 |
| MRR in Å/min | 2873 | 2712 | 5112 | 1496 |
| cSER in Å/min | −5 | −2 | −2 | 2 |
| hSER in Å/min | 9 | 7 | 29 | 85 |
| Cu-hCSER in Å/min | — | — | — | — |
| Dishing Die 1 20 s Overpolish in Å | — | 375 | — | 720 |
| Dishing Die 3 10 s Overpolish in Å | — | 525 | — | 800 |
| Dishing Die 3 30 s Overpolish in Å | — | 612 | — | 960 |

TABLE 2

Compositions of the examples 7 to 8 and of the comparative examples V3 to V4, Cu-cSER, Cu-hSER, Cu-hCSER, pH values and material removal rates (MRR) in the copper CMP process using these compositions, wherein the aqueous medium (F) is de-ionized water.

| | Example 7 | Example 8 | Comparative Example V3 | Comparative Example V4 |
|---|---|---|---|---|
| Particles (A) | NexSil ™ 85K 0.2 wt. % | NexSil ™ 85K 0.001 wt. % | NexSil ™ 85K 0.001 wt. % | NexSil ™ 85K 0.001 wt. % |
| Strong corrosion inhibitor (G) | tolyltriazole 0.005 wt. % | tolyltriazole 0.01 wt. % | tolyltriazole 0.005 wt. % | tolyltriazole 0.01 wt. % |
| Weak corrosion inhibitor (H) | 2-(prop-2-ynyloxy)propanol 0.02 wt. % | 2-(prop-2-ynyloxy)propanol 0.04 wt. % | — | — |
| Complexing agent (D) | Glycine 0.5 wt. % | Glycine 0.5 wt. % | Glycine 0.5 wt. % | Glycine 0.5 wt. % |
| Oxidizing agent (E) | $H_2O_2$ 1 wt. % | $H_2O_2$ 1 wt. % | $H_2O_2$ 1 wt. % | $H_2O_2$ 1 wt. % |
| pH | 6 | 6 | 6 | 6 |
| MRR in Å/min | 5671 | 5602 | 4732 | 2421 |
| cSER in Å/min | — | — | — | — |
| hSER in Å/min | 195 | 67 | 709 | 263 |

TABLE 2-continued

Compositions of the examples 7 to 8 and of the comparative examples V3 to V4, Cu-cSER, Cu-hSER, Cu-hCSER, pH values and material removal rates (MRR) in the copper CMP process using these compositions, wherein the aqueous medium (F) is de-ionized water.

|  | Example 7 | Example 8 | Comparative Example V3 | Comparative Example V4 |
|---|---|---|---|---|
| Cu-hCSER in Å/min | 20 | 20 | — | — |

Figure 1:
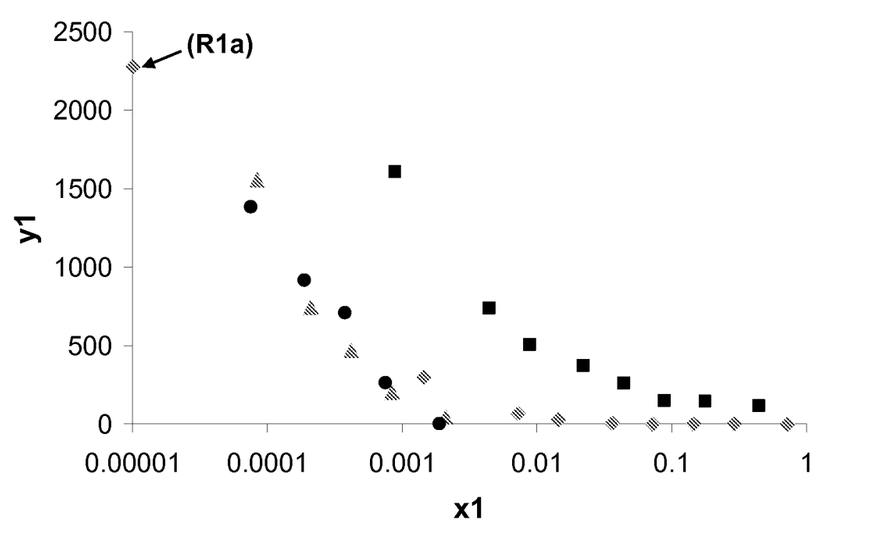

These examples of the CMP compositions of the invention improve the polishing performance FIG. 1 shows the Cu-hSER of different reference compositions:

y1=Cu-hSER in Å/min, x1=concentration of the corrosion inhibitor in the reference composition, The rhomb in FIG. 1 located on the y1 axis, which is linked to (R1a) through an arrow, represent the reference composition (R1a) comprising 0.2 wt. % NexSil™ 85K, 0.5 wt. % glycine, 1 wt. % $H_2O_2$ and having a pH of 6.

The other rhombs in FIG. 1 represent reference compositions (R2a) comprising 0.2 wt. % NexSil™ 85K, 0.5 wt. % glycine, 1 wt. % $H_2O_2$ and different concentrations of 1,2,4-triazole having a pH of 6, wherein the concentration of 1,2,4-triazole is specified on the x1 axis.

The triangles in FIG. 1 represent reference compositions (R2b) comprising 0.2 wt. % NexSil™ 85K, 0.5 wt. % glycine, 1 wt. % $H_2O_2$ and different concentrations of benzotriazole having a pH of 6, wherein the concentration of benzotriazole is specified on the x1 axis.

The circles in FIG. 1 represents reference compositions (R2c) comprising 0.2 wt. % NexSil™ 85K, 0.5 wt. % glycine, 1 wt. % $H_2O_2$ and different concentrations of tolyltriazole having a pH of 6, wherein the concentration of tolyltriazole is specified on the x1 axis.

The squares in FIG. 1 represent reference compositions (R2d) comprising 0.2 wt. % NexSil™ 85K, 0.5 wt. % glycine, 1 wt. % $H_2O_2$ and different concentrations of 2-(prop-2-ynyloxy)propanol having a pH of 6, wherein the concentration of 2-(prop-2-ynyloxy)propanol is specified on the x1 axis.

The invention claimed is:

1. A chemical-mechanical polishing (CMP) composition, comprising:
    inorganic particles, organic particles, or a mixture or composite thereof,
    an N-heterocyclic compound as corrosion inhibitor,
    a further corrosion inhibitor, which is an adduct of an amine and a carboxylic acid comprising an amide moiety, in a concentration of from 0.01 to 5 wt %,
    an oxidizing agent,
    a complexing agent,
    and an aqueous medium,
    wherein the CMP composition has a pH of from 3 to less than 7.

2. The CMP composition according to claim 1, wherein the N-heterocyclic compound is an imidazole, pyrazole, triazole, tetrazole, or a derivative thereof.

3. The CMP composition according to claim 2, wherein the N-heterocyclic compound is a triazole or a derivative thereof.

4. The CMP composition according to claim 1, wherein the amine is a trialkanolamine.

5. The CMP composition according to claim 1, wherein the carboxylic acid comprising an amide moiety is an unsaturated monocarboxylic acid comprising one amide moiety.

6. The CMP composition according to claim 1, wherein the particles are silica particles.

7. The CMP composition according to claim 1, wherein the oxidizing agent is a peroxo compound.

8. The CMP composition according to claim 1, wherein the complexing agent is a carboxylic acid having at least two COOH groups, N-containing carboxylic acid, N-containing sulfonic acid, N-containing sulfuric acid, N-containing phosphonic acid, N-containing phosphoric acid, or a salt thereof.

9. The CMP composition according to claim 1, comprising:
    silica particles, in a concentration of from 0.01 to 2 wt. %,
    a triazole, or its derivative as corrosion inhibitor, in a concentration of from 0.005 to 1 wt. %,
    a further corrosion inhibitor which is an adduct of a trialkanolamine and an unsaturated carboxylic acid comprising at least one amide moiety,
    a peroxide or persulfate as oxidizing agent, in a concentration of from 0.05 to 10 wt. %,
    a complexing agent selected from the group consisting of a carboxylic acid having at least two COOH groups, an N-containing carboxylic acid, N-containing sulfonic acid, N-containing sulfuric acid, N-containing phosphonic acid, N-containing phosphoric acid, or a salt thereof, in a concentration of 0.01 to 5 wt. %, and
    an aqueous medium.

10. A process of manufacturing a semiconductor device, the process comprising chemical-mechanical polishing a metal-containing substrate in the presence of the CMP composition of claim 1.

11. A process of polishing a substrate, the process comprising polishing the substrate with the CMP composition of claim 1, wherein the substrate is suitable for an application in the semiconductor industry.

12. The CMP composition of claim 1, which has a pH of from 3 to 6.

13. The CMP composition of claim 1, wherein the corrosion inhibitor decreases a hot static etch rate of the surface such that a hot static etch rate for a reference composition lacking the further corrosion inhibitor is reduced by at least 75% at a concentration of 0.001 mol/L of the corrosion inhibitor compared to a hot static etch rate for a reference composition lacking both the corrosion inhibitor and the further corrosion inhibitor,
    wherein the further corrosion inhibitor decreases a hot static etch rate such that a hot static etch rate for a reference composition lacking the corrosion inhibitor is reduced by not more than 55% at a concentration of 0.001 mol/L of the further corrosion inhibitor compared to a hot static etch rate for a reference composition lacking both the corrosion inhibitor and the further corrosion inhibitor.

14. A chemical-mechanical polishing (CMP) composition, comprising:
- inorganic particles, organic particles, or a mixture or composite thereof,
- an N-heterocyclic compound as corrosion inhibitor,
- a further corrosion inhibitor which is a (prop-2-ynyloxy)-substituted alcohol, in a concentration of from 0.01 to 5 wt %,
- an oxidizing agent,
- a complexing agent,
- and an aqueous medium,
- wherein the CMP composition has a pH of from 3 to less than 7.

15. The CMP composition according to claim 14, wherein the N-heterocyclic compound is an imidazole, pyrazole, triazole, tetrazole, or a derivative thereof.

16. The CMP composition according to claim 15, wherein the N-heterocyclic compound is a triazole or its derivative.

17. The CMP composition according to claim 14, wherein the further corrosion inhibitor is 2-(prop-2-ynyloxy)ethanol, 2-(prop-2-ynyloxy)propanol, 2-(prop-2-ynyloxy)butanol, or 2-(prop-2-ynyloxy)pentanol.

18. The CMP composition according to claim 14, wherein the particles are silica particles.

19. The CMP composition according to claim 14, wherein the oxiding agent is a peroxo compound.

20. The CMP composition according to claim 14, wherein the complexing agent is a carboxylic acid having at least two COOH groups, N-containing carboxylic acid, N-containing sulfonic acid, N-containing sulfuric acid, N-containing phosphonic acid, N-containing phosphoric acid, or a salt thereof.

21. A process of manufacturing a semiconductor device, the process comprising chemical-mechanical polishing a metal-containing substrate in the presence of the CMP composition of claim 14.

22. A process of polishing a substrate, the process comprising polishing the substrate with the CMP composition of claim 14, wherein the substrate is suitable for an application in the semiconductor industry.

23. The CMP composition of claim 14, which has a pH of from 3 to 6.

24. A chemical mechanical polishing process, the process comprising:
- chemical mechanical polishing a surface of a metal-comprising substrate with a chemical mechanical polishing composition,
- wherein the composition comprises:
- inorganic particles, organic particles, or a mixture or composite thereof,
- an oxidizing agent,
- a complexing agent,
- an aqueous medium,
- a strong corrosion inhibitor,
- and a weak corrosion inhibitor, which is an adduct of an amine and a carboxylic acid comprising an amide moiety, in a concentration of from 0.01 to 5 wt %,
- wherein the composition has a pH of from 3 to less than 7,
- wherein the strong corrosion inhibitor is capable of strongly decreasing a hot static etch rate of the surface such that a hot static etch rate for a reference composition lacking the weak corrosion inhibitor is reduced by at least 75% at a concentration of 0.001 mol/L of the strong corrosion inhibitor compared to a hot static etch rate for a reference composition lacking both the strong corrosion inhibitor and the weak corrosion inhibitor,
- wherein the weak corrosion inhibitor is capable of weakly decreasing a hot static etch rate such that a hot static etch rate for a reference composition lacking the strong corrosion inhibitor is reduced by not more than 55% at a concentration of 0.001 mol/L of the weak corrosion inhibitor compared to a hot static etch rate for a reference composition lacking both the strong corrosion inhibitor and the weak corrosion inhibitor.

25. The process of claim 24, wherein the composition has a pH of from 3 to 6.

* * * * *